(12) United States Patent
Xiao et al.

(10) Patent No.: US 11,688,640 B2
(45) Date of Patent: *Jun. 27, 2023

(54) SYSTEMS AND METHODS FOR MANUFACTURING FLEXIBLE ELECTRONICS

(71) Applicant: NEXT Biometrics Group ASA, Oslo (NO)

(72) Inventors: Tian Xiao, Everett, WA (US); King Hong Kwan, Bellevue, WA (US); Sheng-Hsiang Hung, Zhubei (TW); Mark W. Naumann, Los Gatos, CA (US)

(73) Assignee: NEXT Biometrics Group ASA, Oslo (NO)

( * ) Notice: Subject to any disclaimer, the term of this patent is extended or adjusted under 35 U.S.C. 154(b) by 0 days.

This patent is subject to a terminal disclaimer.

(21) Appl. No.: 17/578,660

(22) Filed: Jan. 19, 2022

(65) Prior Publication Data
US 2022/0139781 A1    May 5, 2022

Related U.S. Application Data

(63) Continuation of application No. 16/850,729, filed on Apr. 16, 2020, now Pat. No. 11,264,279.
(Continued)

(51) Int. Cl.
*H01L 21/78* (2006.01)
*H01L 21/56* (2006.01)
(Continued)

(52) U.S. Cl.
CPC ............ *H01L 21/78* (2013.01); *H01L 21/561* (2013.01); *H01L 21/84* (2013.01); *B81C 1/00269* (2013.01); *H01L 23/298* (2013.01)

(58) Field of Classification Search
CPC ....... H01L 21/78; H01L 21/561; H01L 21/84; H01L 27/1262; H01L 27/1218
(Continued)

(56) References Cited

U.S. PATENT DOCUMENTS 6,597,051 B2 * 7/2003 Lubomirsky ..... H01L 27/14687
257/431
7,485,547 B2    2/2009 Yamamura et al.
(Continued)

FOREIGN PATENT DOCUMENTS

| EP | 2466432 A2 | 6/2012 |
| JP | 2012051777 A | 3/2012 |
| WO | 2016073551 A1 | 5/2016 |

*Primary Examiner* — Vu A Vu
(74) *Attorney, Agent, or Firm* — Duane Morris LLP

(57) ABSTRACT

Systems and methods for manufacturing flexible electronics are described herein. Methods in accordance with embodiments of the present technology can include disposing electrical features, such as thin film circuits, on a first side of a glass substrate, applying a first protective material over the electronic features, and exposing a second side of the glass substrate to a chemical etching tank to thin the glass substrate to a predetermined thickness. The thinning process can remove cracks and other defects from the second side of the glass substrate and enhance the flexibility of the electronic assembly. A second protective material can be disposed on the second side of the thinned glass substrate to maintain the enhanced backside surface of the glass substrate. In some embodiments, the method also includes singulating the plurality of electronic features into individual electronic components by submerging the electronic assembly into a chemical etching tank.

19 Claims, 7 Drawing Sheets

Related U.S. Application Data

(60) Provisional application No. 62/834,720, filed on Apr. 16, 2019.

(51) Int. Cl.
  *H01L 21/84* (2006.01)
  *B81C 1/00* (2006.01)
  *H01L 23/29* (2006.01)

(58) Field of Classification Search
  USPC .......................................................... 438/113
  See application file for complete search history.

(56) References Cited

U.S. PATENT DOCUMENTS

| | | | |
|---|---|---|---|
| 7,972,910 B2 * | 7/2011 | Dairiki | H01L 27/1214 |
| | | | 438/149 |
| 8,048,781 B2 | 11/2011 | How | |
| 8,202,786 B2 * | 6/2012 | Von Koblinski | H01L 24/05 |
| | | | 438/459 |
| 8,507,322 B2 * | 8/2013 | Chida | H01L 21/78 |
| | | | 438/118 |
| 8,563,112 B2 * | 10/2013 | Suzuki | H01L 51/5253 |
| | | | 428/76 |
| 8,765,504 B2 | 7/2014 | Chen et al. | |
| 9,321,574 B2 * | 4/2016 | Garner | B65B 61/22 |
| 10,865,104 B2 * | 12/2020 | Bedjaoui | H01L 23/291 |
| 11,264,279 B2 * | 3/2022 | Xiao | H01L 21/84 |
| 2004/0142118 A1 | 7/2004 | Takechi | |
| 2008/0295885 A1 * | 12/2008 | Lee | H01L 31/1872 |
| | | | 136/256 |
| 2012/0223049 A1 | 9/2012 | Yoshikawa et al. | |
| 2012/0247658 A1 | 10/2012 | Kawada | |
| 2014/0238952 A1 | 8/2014 | Makino et al. | |
| 2017/0032981 A1 | 2/2017 | Chinnusamy | |

* cited by examiner

SYSTEMS AND METHODS FOR MANUFACTURING FLEXIBLE ELECTRONICS

PRIORITY CLAIM AND CROSS-REFERENCE

This application is a continuation of U.S. patent application Ser. No. 16/850,729, filed Apr. 16, 2020, which claims priority to U.S. Provisional Patent Application No. 62/834,720, filed on Apr. 16, 2019, which applications are expressly incorporated by reference herein in their entirety.

TECHNICAL FIELD

The present technology relates to manufacturing flexible electronics. More specifically, the present technology relates to methods for manufacturing higher performance and lower cost electronic components.

BACKGROUND

The increasing interest in flexible displays (e.g., organic light-emitting diode ("OLED"), liquid-crystal display ("LCD"), and electronic paper display ("EPD")), sensors, and near field communication ("NFC")-based devices has led to the advancement of large area flexible electronics. Most of these flexible electronics utilize thin film transistor ("TFT") arrays, which include electronic components formed on polyimide ("PI") materials. PI is useful because it highly flexible and can naturally insulate electronics. During manufacture, a PI layer is laminated onto mother glass (e.g., a rigid, durable glass), or other type of substrate, to provide a rigid backing while the electronic circuits are formed on the overlying PI layer. The PI layer is then delaminated from the mother glass, and subsequently laminated onto a flexible substrate, such as a polyethylene terephthalate ("PET") substrate, to provide flexible mechanical support.

Due to significant differences in mechanical, thermal and chemical properties of the compliant organic substrate materials and the stiff inorganic TFT materials, there are many technical challenges associated with the manufacturing process. For example, unless a high quality, expensive PI is used, the heat implicit in manufacturing electronics can cause various types of defects in the TFTs and PI layer. Due to lower temperature tolerance of PI substrate as compared to TFT glass, processing temperatures have to be lowered for thin film devices fabricated on the PI substrate, limiting the full potential of the device performance. Further, there are limited options available for the flexible substrate used to back the PI layer (after the electronics are manufactured thereon) given the need for heat resistance and mechanical durability.

BRIEF DESCRIPTION OF THE DRAWINGS

Many aspects of the present disclosure can be better understood with reference to the following drawings. The components in the drawings are not necessarily to scale, and instead emphasis is placed on clearly illustrating the principles of the present disclosure. Similarly, some components and/or operations can be separated into different blocks or combined into a single block for the purpose of discussion of some of the implementations of the present technology. For ease of reference, throughout this disclosure identical reference numbers and/or letters are used to identify similar or analogous components or features, but the use of the same reference number does not imply that the parts should be construed to be identical. Indeed, in many examples described herein, identically numbered components refer to different embodiments that are distinct in structure and/or function.

DETAILED DESCRIPTION

Figure 1:
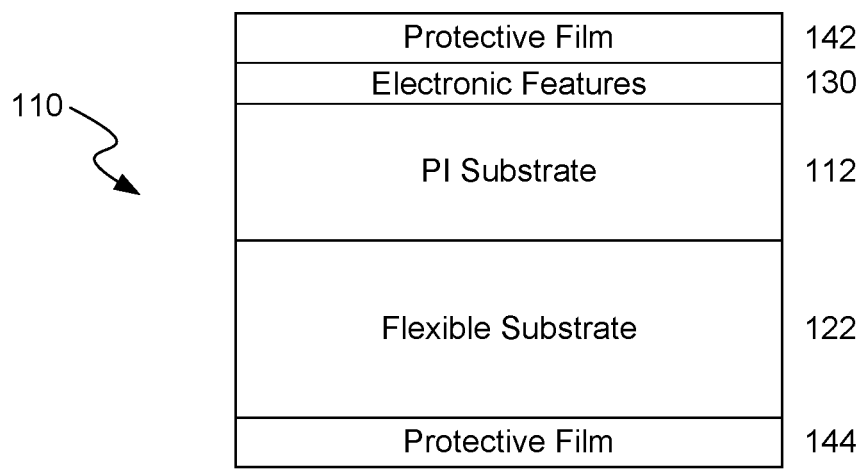
FIG. 1 is a partially schematic cross-sectional view of an electronic assembly.

Systems and methods for manufacturing flexible electronics, such as large area flexible electronics based on thin film circuits, are described herein. In some embodiments, for example, the systems and methods described herein form electrical features (e.g., TFTs and other thin film circuits) directly on a glass substrate, and thin the glass substrate to serve as the base for the packaged flexible electronic components. The systems and methods disclosed here in can also remove microcracks and other defects (pre-existing in the glass or introduced by handling during electronics manufacturing) from the surface of the glass substrate and/or the subsequently singulated electrical components. This provides for low cost and high yield manufacturing processes due to a good match of mechanical, thermal and chemical properties of the glass substrates and inorganic thin film circuit materials.

Specific details of several embodiments of the technology are described below with reference to FIGS. 1-7D. Although many of the embodiments are described below with respect to systems and methods for manufacturing flexible electrical components for flexible biometric sensors, other applications and other embodiments in addition to those described herein are within the scope of the technology. For example, the present technology may be used for manufacturing electrical components for flexible displays, such as flexible LCDs and OLEDs. Additionally, some well-known structures or functions may not be shown or described in detail, so as to avoid unnecessarily obscuring the relevant description of the various embodiments. Moreover, several other embodiments of the technology can have different configurations, components, or procedures than those described herein, and features of the embodiments shown can be combined with one another. A person of ordinary skill in the art, therefore, will accordingly understand that the technology can have other embodiments with additional elements, or the technology can have other embodiments without several of the features shown and described below with reference to FIGS. 1-7D.

In some embodiments, the present technology can be used to manufacture thin film circuits, such as TFTs, and other thin film electrical features onto flexible glass for use in a biometric system, such as a fingerprint sensor and a Biometric System on Card (BSoC). TFTs are a special type of metal-oxide-semiconductor field-effect transistor (MOSFET) that can be made by depositing thin films of an active semiconductor and dielectric layers over a supporting substrate. The resulting flexible electronic component, such as a flexible fingerprint sensor or flexible LCDs and OLEDs, can then be integrated into an electronic system, such as a BSoC or flexible display. The flexibility of the resulting electronic system may be limited by the flexibility of the TFTs' underlying substrate, partly due to microcracks and/or other defects or impurities introduced into the substrate during manufacturing. Those defects or impurities amount to failure points for the electronic system under mechanical stress from bending, impact shocks, etc.

One method of manufacturing these flexible electronic components includes selecting a core-substrate that is highly flexible, such as a polyimide substrate. However, polyimides are so flexible that they must still be laminated onto at least one other, more rigid substrate to support the electrical features formed thereon (typically two different substrates: one used during formation of the electronic features and one used thereafter for integration into an electronic system). The complexity of manufacturing process and high cost of quality polyimide needed for thin film circuits can introduce significant costs into the manufacturing processes.

The systems and methods disclosed herein manufacture electronics directly on a flexible glass substrate. In some embodiments, for example, the present technology uses a sheet-to-sheet manufacturing process typically used to manufacture electronics onto polyimide substrates supported by rigid glass substrates, but instead removes the polyimide to dispose the thin film electronic features directly onto glass substrates. In these embodiments, the method can include disposing a plurality of electronic features (e.g., TFTs and other thin film circuits) on a first side of a sheet of glass. The back side of the glass sheet can then be chemically thinned to remove cracks, impurities, or other potential failure points from the surface of the flexible glass sheet so as to increase its flexibility. The method can then laminate or coat the back side of the sheets with a protective laminate. In some embodiments, the method can continue by singulating the sheet into individual electrical components using a chemical dicing technique. For example, a laser can partially scribe the glass (e.g., as a continuous line or plurality of spaced apart indents that creates a scored surface) to define cutting tracks around the individual electronic components before submerging the sheet into a chemical etching tank to complete the singulation along the cutting tracks. After singulation, a protective coating (e.g., a liquid polymer) can be formed on the exposed surfaces and edges of the individual electronic components.

The flexible electronic components manufactured using the processes described herein include a flexible glass substrate with a higher failure stress than the electronic features manufactured thereon. Accordingly, in some embodiments, during or after singulation, the exterior edges and surfaces of the electronic components can be chemically etched to remove microcracks near the surface, round exterior edges to enhance failure stress, and remove other impurities potentially susceptible to fracture. In some embodiments, the methods and systems disclosed herein include a roll-to-roll manufacturing process using flexible glass laminate.

In some embodiments, the method can include chemically thinning a flexible glass substrate to remove defects from the flexible glass substrates via a roll-to-roll process. The method can then apply a protective coating to one surface of the glass substrate, leaving the opposite surface exposed for electronics manufacturing (e.g., thin film deposition). In some embodiments, the method can utilize roll-to-roll manufacturing processes to deposit a plurality of individual electronic features on the exposed surface of the flexible glass substrate, thereby providing a high throughput manufacturing process. In some embodiments, the method can then perform singulation to separate the plurality of electronic features on the flexible glass substrate into a plurality of electronic components.

FIG. 1 is a partially schematic cross-sectional view of a packaged electronic assembly 110 manufactured in accordance with current TFT processing techniques. The electronic assembly 110 has a polyimide ("PI") substrate 112 (also referred to as a "PI layer 112") serving as the core of the electronic assembly 110, a flexible support substrate 122 (e.g., a PET substrate) carrying the PI substrate 112, and electronic features 130 (e.g. a plurality of thin film circuits for biometric sensors, etc.) carried by the PI substrate 112. As further illustrated in FIG. 1, the electronic assembly 110 also includes a first or upper protective film 142 disposed over the electronic features 130 and a second or lower protective film 144 disposed on the bottom surface of the flexible substrate 122. In some applications, the first protective film 142 will be removed once manufacturing is otherwise complete to expose the electronic features 130 to allow, for example, for electronic connection to the electronic features 130.

The electronic assembly 110 is formed by removably adhering (e.g., laminating) the PI substrate 112 to a temporary support substrate (not shown), and then forming the electronic features 130 on the PI substrate 112. The temporary support substrate can be a rigid material, such as glass (i.e., referred to as a "mother" glass substrate or sheet) that provides support to the extremely flexible PI substrate 112 as electronic features 130 are formed thereon and also has material properties compatible with those of the PI substrate 112 as the two undergo semiconductor processing steps. After the electronic features are formed, the back side of the temporary support substrate is exposed to a laser that melts and/or vaporizes the glue between the temporary support substrate and the PI substrate 112, thereby allowing the PI substrate 112 to be fully removed from the temporary support substrate. The PI substrate 112 with the electronic components is then laminated to the flexible substrate 122. The electronic assembly 110 can be highly flexible due to the small bend radius of the support substrate 122 and the PI substrate 112. However, the complexities of the manufacturing process can be expensive and can reduce fabrication yields. For example, the delamination of the PI substrate 112 from the temporary support substrate may vaporize some of the PI substrate 112 to enable removal from the temporary glass support. In addition, there are few materials suitable for the flexible support substrate 122, and both the flexible support substrate 122 and PI layer 112 can be sensitive to temperature. Even the temperatures reached to laminate the PI layer 112 to the flexible substrate 122 can cause deformations and/or other manufacturing defects that decrease the fabrication yield.

Figure 2A:
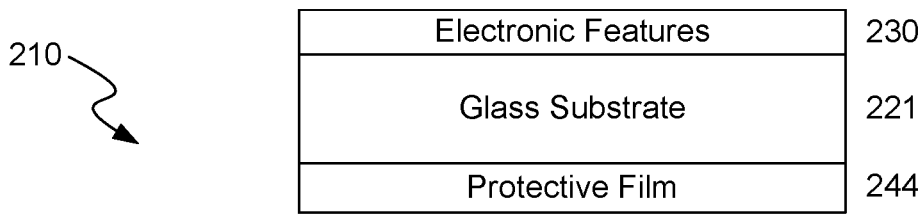
FIG. 2A is a partially schematic cross-sectional view of an electronic assembly manufactured according to some embodiments of the present technology.

FIG. 2A is a partially schematic cross-sectional view of an electronic assembly 210 manufactured in accordance with embodiments of the present technology. The electronic assembly 210 includes a thinned, flexible glass substrate 221 (also referred to as a "glass substrate 221") and electronic features 230 (e.g., TFTs and other thin film circuits) disposed directly on a first side of the glass substrate 221. In some embodiments, a first protective film 242 (not shown) can be disposed on the electronic features 230 to protect the electronic features 230 during manufacturing, while the second side of the glass substrate 221 is covered by a second protective film 244. In the illustrated embodiment, the first protective film 242 has been removed to expose the electronic features 230, while the second protective film 244 has been left on for continued protection of the glass substrate 221. Manufacturing electronics directly onto the glass substrate 221 can enhance manufacturing efficiencies and device performance, reduce costs, and increase fabrication yields. For example, the manufacturing process includes fewer steps—eliminating the need to laminate the PI substrate to a temporary glass support substrate for electronics manufacturing, delaminate, and laminate to a more rigid plastic backing to complete production. The glass substrate 221 is also more resistant to the heat implicit in manufacturing, more durable to scratching or indentation, and/or easier to manipulate than the flexible support substrate of the electronic assembly 110 of FIG. 1. Flexible glass, such as that used for the glass substrate 221, typically includes small microcracks and other defects in the surface that can limit the reliability and flexibility of the resulting electronic assembly 210. Accordingly, the present technology removes or substantially eliminates such cracks and defects to provide for reliable, flexible glass substrates.

In particular, the failure stress $\sigma_f$ for a substrate, such as the flexible glass substrate 221, is determined by Equation (1):

$$\sigma_f = K_{1c}/(\alpha\sqrt{\pi a}) \qquad (1)$$

where $K_{1c}$ is the fracture toughness of glass, $\alpha$ is a geometrical parameter (typically about 1.12 for cracks on the surface or edges of glass), and a is the maximum length of cracks existing in the glass. $K_{1c}$ and $\alpha$ are dictated once the type of glass, or other flexible substrate, is chosen, while the length of the cracks a remains a variable in the denominator of Equation (1). Accordingly, reducing the length of the crack a on the surface and/or an edge of the glass results in a corresponding increase in the failure stress for the glass. Increasing the flexibility in the glass also increases the flexibility of the electronic unit using the glass. The present technology includes systems and methods for reducing and/or nearly eliminating cracks and other defects in the surface of the glass used to manufacture flexible electronic components.

Figure 2B:
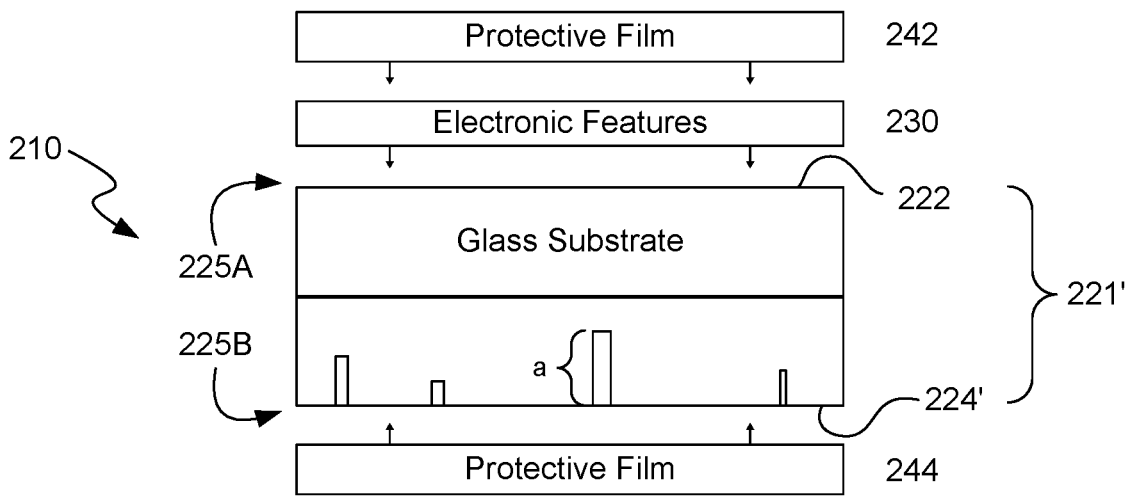
FIG. 2B is an exploded cross-sectional view of the electronic assembly of FIG. 2A during an intermediate stage of a manufacturing process in accordance with embodiments of the present technology.

FIG. 2B is an exploded cross-sectional view of the electronic assembly 210 of FIG. 2A during an intermediate stage of a manufacturing process in accordance with embodiments of the present technology. The flexible glass substrate 221' is in a pre-thinned state, and has a first side 225a (also referred to as an "upper side," "front side," or "electronics side") with a first surface 222 (also referred to as an "upper surface," "front surface," or "electronics surface"), a second side 225b (also referred to as a "lower side" or "back side") with a second surface 224' (also referred to as a "lower surface" or "back surface") opposite the first side 225a, and a thickness between the first and second surfaces 222, 224'. As shown in FIG. 2B, the electronic features 230 are disposed on the first surface 222 and subsequently covered with the first, upper protective film 242. The first surface 222 is substantially free from impurities, whereas the second surface 224' contains a plurality of cracks and/or defects. For example, the second surface 224' includes a crack that has a length a. These cracks and other defects can be the result of the process for manufacturing the flexible glass substrate 221' itself and/or the process (e.g., during robotic handling of the back surface) for manufacturing electronics on the first surface 222 of the flexible glass substrate 221'. In the illustrated embodiment, the failure stress of the electronic assembly 210 will be limited by the failure stress of the flexible glass substrate 221' and can be calculated using Equation (1) and the length of the crack a.

Figure 2C:
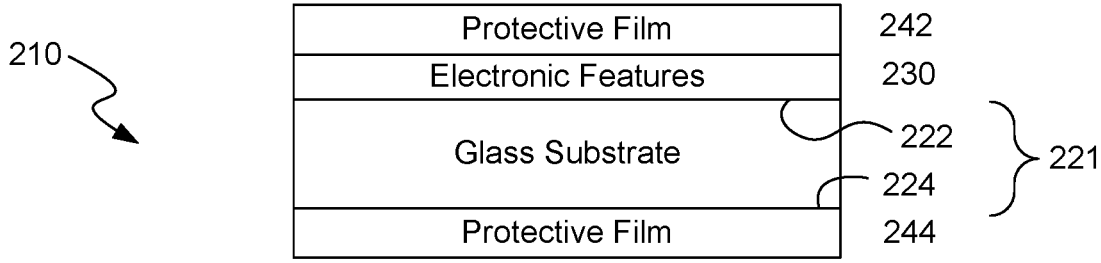
FIG. 2C is a partially schematic cross-sectional view of the electronic assembly of FIG. 2B in a subsequent manufacturing stage in accordance with some embodiments of the present technology.

FIG. 2C is a cross-sectional view of the electronic assembly 210 of FIG. 2B in a subsequent manufacturing stage with the flexible glass substrate 221 that has been processed to remove defects in accordance with some embodiments of the present technology. As shown in FIG. 2C, the flexible glass substrate 221 has been thinned to a predetermined thickness by removing substrate material from the second side 225b (FIG. 2B) of the glass substrate 221 to define a new second surface 224. The glass substrate 221 can be thinned by partially or fully submerging the electronic assembly 210 in a chemical etching tub that exposes the second side 225b to a chemical that removes material from the second side 225b while the protective film 242 prevents the chemical bath from effecting the electronic features 230 on the first side 225a of the electronic assembly 210. In some embodiments, the second side 225b of the glass substrate 221 can be thinned using other suitable thinning techniques. Removing the substrate material from the second side 225b also removes cracks and other defects to form the second surface 224 at least substantially free from cracks and defects. As a result, the failure stress of the electronic assembly 210 is significantly improved (e.g., the length of any cracks a input into the denominator of Equation (1) has been significantly reduced). In some embodiments, the second protective film 244 can be applied immediately after removing defects from the lower surface 224. In some embodiments, the second, lower protective film 244 can be selected based on mechanical protection qualities (e.g., scratch resistance, impact damping, durability, etc.) and chemical protection qualities (e.g., protection against acid exposure).

The result of thinning the glass is that the flexible glass substrate 221 has a significantly higher failure stress than that of the original glass substrate 221' of FIG. 2B. In addition, the thinned substrate enhances the flexibility or bendability of the electronic assembly 210 to allow for flexible applications, such as in cards with biometric sensors. In some embodiments, for example, the failure stress allows the electronic assembly 210 to be bent to a bending radius of from about 40 mm to about 30 mm before failure. In other embodiments, the bend radius may be less than 30 mm or higher than 40 mm depending upon the degree of thinning, the materials and structures of the electronic assembly 210, and/or the specifications for the desired use (e.g., embedded in a flexible card, a flexible display or sensor of a wearable).

Figure 3:
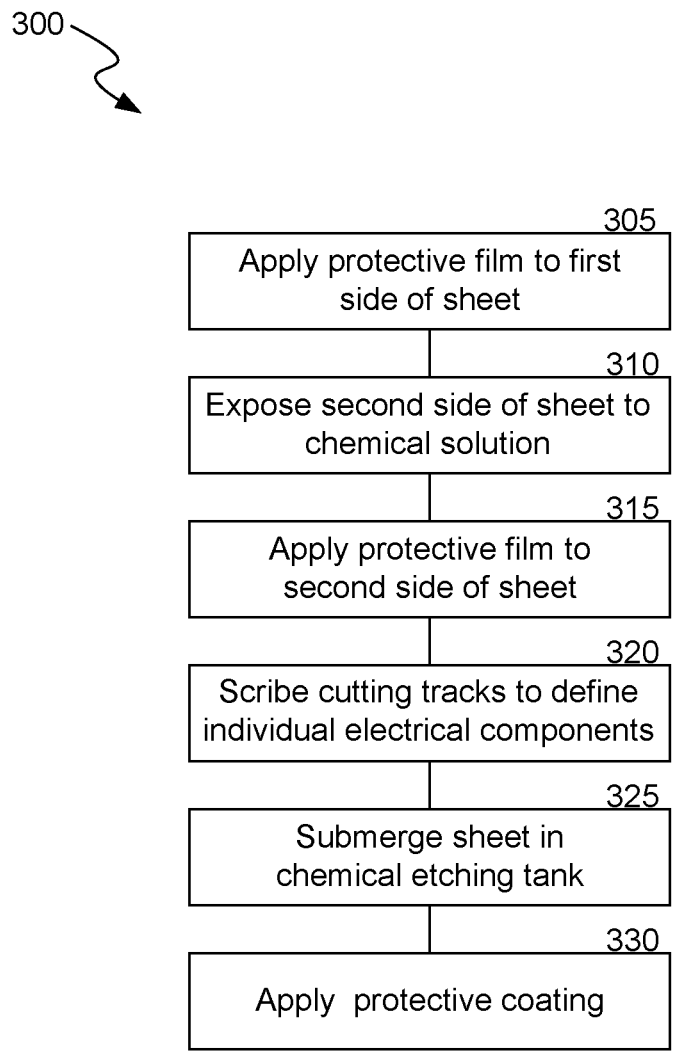
FIG. 3 is a block diagram illustrating a process of manufacturing flexible electronics directly onto glass in accordance with embodiments of the present technology.

FIG. 3 is a block diagram illustrating a process 300 for manufacturing flexible electronics directly onto flexible glass in accordance with embodiments of the present technology. The sheet-to-sheet process 300 can be used to improve the flexibility of glass after TFTs, other thin film circuits, and/or other electronic features are formed on a first surface of the glass substrate. The process 300 can be used to reduce or remove cracks and other defects from the back surface of the glass substrate, separate a sheet containing a plurality of electronic features into individual electronic components without introducing new impurities, and/or apply protective films and/or coatings to the electronic components.

The process 300 can include disposing thin film circuits (e.g., TFTs) or other flexible electronic features on a first side of the sheet of glass substrate. In some embodiments, the electronic features are already formed on the glass substrate. As shown in FIG. 3, at block 305, the process 300 applies a protective film to the first side of the sheet over the electrical features. The protective film provides a material barrier that protects the electronic features from exposure to chemicals, heating, and/or other external exposure during later stages of the process 300. In some embodiments, the protective film on the first side of the sheet is applied for temporary use, for example using an adhesive that can be later removed. In some embodiments, the protective film permanently adheres over the top of the electronic features and the first side of the glass substrate. The protective film can be a PET film with a thickness between about 50 μm to about 500 μm.

At block 310, the process 300 exposes the second side of the glass sheet to a chemical solution to chemically remove material from the second side of glass and thin the glass sheet to a predetermined thickness. Chemical thinning is used to remove cracks, defects, and/or impurities from the second surface of the glass. For example, these cracks, defects, and/or impurities in the glass primarily exist in an outer region of the glass substrate extending from the outer surface of the glass to a depth into the glass substrate. The chemical solution strips away this outer layer without introducing new cracks, defects, and/or impurities, leaving a smooth surface with little to no cracks, defects, and/or impurities therein. In some embodiments, the chemical etching step (block 310) etches away from about 0.2 mm to about 0.3 mm from the second side of the sheet. In some embodiments, the chemical etching step (block 310) etches away at least 0.3 mm of the glass on the second side of the sheet, for example to ensure elimination of even the deeper cracks existing on the second side of the sheet of glass substrate, thereby reducing the impact any such cracks have on the material properties (e.g., flexibility) of the glass. Further, the chemical etching also thins the overall thickness of the glass sheet (e.g., from 0.5 mm to 0.2 mm or less), which increases the flexibility (e.g., bend radius) of the subsequently singulated electrical components.

The chemical solution includes a hydrofluoric acid solution and/or other chemical that etches glass. In some embodiments, the thinning step of block 310 includes completely submerging the sheet (glass substrate and electrical components disposed thereon) into a chemical etchant tank containing the chemical solution (also referred to as a "chemical bath") to controllably dissolve all exposed surfaces of the sheet. The protective film can protect the electronic features from exposure to the chemical solution such that only the desired surface(s) is(are) etched. In some embodiments, the thinning step of block 310 includes only partially submerging the second surface in a chemical etching tank and/or directing the chemical solution onto the second surface via a hose and nozzle to controllably dissolve selected outer surfaces of the sheet. In some embodiments, the glass substrate of the sheet is thinned from a thickness of about 0.5 mm to a thickness of from about 0.05-0.2 mm to about 0.05 mm; from about 0.15 mm to about 0.08 mm; or of about 0.15 mm. [

At block 315, the process 300 applies a second protective film to the second side of the sheet (i.e., the back surface of the thinned glass) to provide mechanical and/or chemical protection to the cleaned surface and avoid subsequent formation of cracks or other defects. The second protective film can be applied through a lamination process, coating process, or other appropriate method known in the art.

The second protective film can be constructed from a plastic material, an organic film, such as PET, an inorganic-organic hybrid material, and/or nanocomposite, such as nano-silica particulate in epoxy, urethane, and/or acrylic. In some embodiments, the first and second protective films are comprised of the same material. In other embodiments, the first and second protective films are constructed from different materials. In some embodiments, the second protective film is selected based on its mechanical qualities. For example, because the second protective film may be a permanent protective film, it can be selected to have a damping or high impact absorbent properties to protect the flexible electronic devices from impact damage. In some embodiments, the second protective film is permanently coated onto the second surface. In some embodiments, the second protective film does not dissolve, or dissolves very slowly, when exposed to a chemical solution (e.g., hydrofluoric acid) that can be, for example, used in further chemical processes described below. In some embodiments, the second protective film and/or the thickness of the second protective film can be also selected based on the flexibility of the material. In some embodiments, the second protective film can have a thickness of from about 50 μm to 500 μm.

The sheet can include electronic features that define a plurality of electronic components. In these embodiments, the process 300 continues through blocks 320 and 325 for device singulation. In block 320, the process 300 uses a laser to scribe the sheet to define cutting tracks that define a border between individual electronic components (e.g. individual displays, sensors, etc.). The laser scribing can form cutting tracks (e.g., intents or recesses) from the first side and/or the second side of the glass substrate. In some embodiments, the first and/or second protective films can be transparent, and alignment tracks (also referred to as alignment guides, lines, or aids) deposited on the underlying material (e.g., the glass substrate) to map out the cutting tracks during previous manufacture steps (e.g., during formation of the electronic features). These alignment guides can then be used to guide the laser during the scribing process to form the cutting tracks. In some embodiments, the cutting tracks can be pre-set and pre-loaded into a computer system (e.g., a software application) guiding the laser. In various embodiments, the laser can be selected from various laser types with appropriate frequency or wavelength (e.g., diode-pumped solid-state laser with IR wavelength), where laser pulse energy density and power density can be controlled evenly over the spatial domain, e.g., by a PSO (Position Synchronized Output) technique. Controlling the wavelength, pulse energy, and/or power density can allow for control over the shape and depth of the etched cutting tracks. Further, in various embodiments, the laser can be used with either single focus or multi-focus methods.

In some embodiments, the laser scribing can include using the laser to scribe the cutting tracks in a continuous (e.g., unbroken) line. In these embodiments, the cutting tracks can extend only partway through the sheet. In some embodiments, a laser can be used to form (i.e., "drill") holes periodically spaced apart from each other along the sheet to define the cutting tracks. Such cutting tracks resemble perforation lines. In some embodiments, the laser material processes described above can be performed on only one side of the sheet. For example, a laser can be used to scribe a continuous line on only the first surface. In other embodiments, the laser scribing processes can be performed on both sides. In these embodiments, the laser scribing can occur either on both sides simultaneously or on each side sequentially. Compared to mechanical cutting, laser etching largely reduces introduction of new cracks and chips into the sheet while reducing residual stress from contact during mechanical cutting.

The laser scribing does not fully cut through (i.e., singulate) the individual electrical components. In part, this is because the continued exposure to heat required for completely cutting through the sheet may cause small micro explosions on the cutting surface, introducing minor cracks and/or other impurities in the glass exposed to the laser.

Accordingly, at block 325 the process 300 continues by exposing the sheet to a chemical etchant that completes singulation of the individual electronic components, while smoothing any new cracks or defects along the exposed surfaces (e.g., the sidewalls of the individual electronic components). In particular, the chemical etching process (block 325) dissolves the sheet along the cutting tracks, which were exposed from the protective film(s) during laser scribing. The chemical dicing can also form smooth, rounded edges that reduce potential facture sites and remove at least some of the cracks or other defects introduced to the glass or other material during laser scribing.

In some embodiments, the chemical dicing (block 325) can be completed by submerging the sheet into a chemical etching tank. In some embodiments, the chemical etching tank can be the same tank used to chemically thin the flexible glass at block 310. In some embodiments, the chemical etching can be accomplished using a hose and nozzle to direct a chemical solution at the cutting tracks.

In some embodiments, the process 300 is used to manufacture a stand-alone electronic component and/or a plurality of electronics that work in conjunction, without the need for singulation. In these embodiments, the process 300 omits the steps of blocks 315 and 320 and proceeds directly to block 330.

At block 330, the process 300 proceeds by applying a protective coating to the individual electronic components. This protective coating (also referred to as a "protective coating" or "protective film") can be applied to the newly exposed side surfaces of the singulated electrical components to protect from the external environment and avoid cracks or other defects. The protective coating can also or alternatively be applied to the second side of the glass substrate (over the previously applied protective film) and/or over the first side of the glass substrate on the electronic features (over the previously applied protective film). In various embodiments, the protective films on the first and second sides can be removed in favor of applying the final protective coating.

In some embodiments, the protective coating step of block 330 can include a series of steps as well. For example, in some embodiments, block 330 includes a first step of coating the electronic units (individual or sheet) with a liquid polymer; a second step of soft baking the electronic units to partially cure the liquid polymer; a third step of removing the first protective film, thereby exposing the electronics on the first surface to allow them to receive, e.g., electrical contacts; and a fourth step of hard baking to finish curing the liquid polymer. In various embodiments, the electronic units can be coated in the liquid polymer via dip coating, spray coating, nozzle printing, etc.; or the electronic units can be placed horizontally on a chuck with holding cells for the electronic units, and programmable polymer solution dispenser (e.g., an inkjet printer) can dispense polymer solution around all edges of the electronic units.

In some embodiments, the chemical thinning described in block 310 and chemical dicing described in blocks 320-325 can occur during the same stage of the process 300. For example, in some embodiments, the sheet can be laser-scribed with cutting tracks immediately after the first protective film is applied over the electronics layer, then submerged in a chemical tank to simultaneously thin the glass by dissolving the second surface and complete the chemical etching process. In these embodiments, the laser etching process can be calibrated to etch cutting tracks that allow sufficient material to be dissolved from the second surface while the cutting tracks are dissolved. In some embodiments, a second protective film can be applied to individual electronic components after their singulation before being coated by a polymer in block 330. In other embodiments, the individual electronic components can directly be coated by the polymer in block 330.

FIGS. 4A-4D are. isometric views illustrating an electronic assembly 410 (also referred to as a "sheet 410") including a plurality of individual electronic features 432 at various stages of the sheet-to-sheet process described above with reference to FIG. 3.

Figures 4A, 4B:
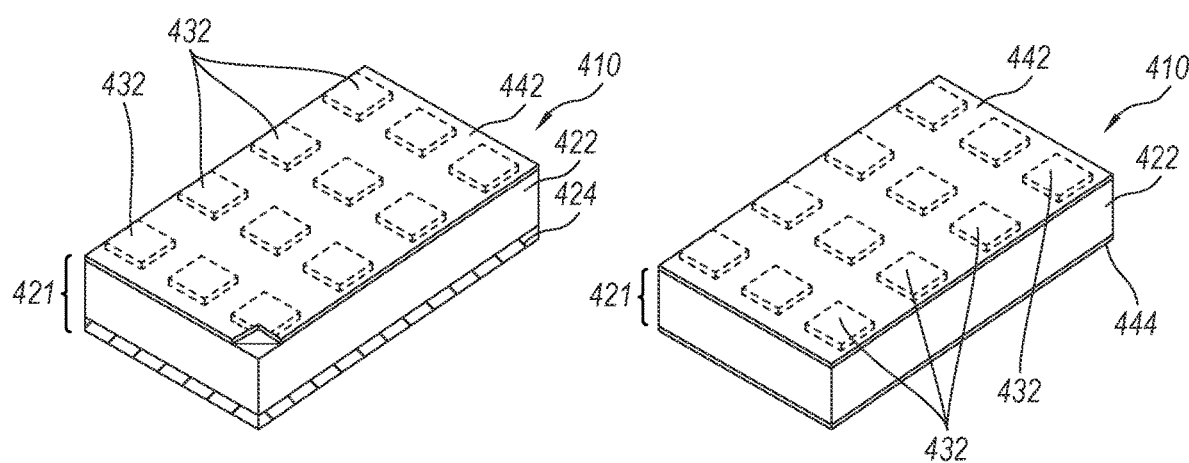
FIGS. 4A-4D are isometric views illustrating a method of manufacturing electronic assemblies in accordance with embodiments of the present technology.

FIG. 4A illustrates the sheet 410 at an early stage of the manufacturing process. The sheet 410 includes a glass substrate 421 having a first portion 422 with a low level of defects (e.g., cracks) and a second portion 424 having a higher level of defects. As shown in FIG. 4A, the second portion 424 extends from the outer surface of the glass substrate 421 into the glass substrate 422 by a distance. The plurality of individual electronic features 432 are disposed on an upper (e.g., first) surface of the glass substrate 421, covered by a first protective film 442. In one embodiment, the sheet 410 is then submerged in chemical tank to thin the glass.

FIG. 4B illustrates the sheet 410 after a chemical thinning process. The chemical thinning process can include submerging at least the second side of the sheet 421 in a chemical etching tank and/or directing a chemical etchant toward the second side of the sheet 421. The chemical dissolves a portion of the glass substrate from the exposed surfaces to a predefined depth. The first protective film 442 prevents the chemical etchant from removing or otherwise effecting the underlying electronic features 432. As shown in FIGS. 4A and 4B, the chemical etchant is applied to the lower (e.g., the second) surface, thereby dissolving the high-defect, second portion 424 and exposing the underlying low-defect, first portion 422. As further shown in FIG. 4B, the first portion can be coated with a second protective film 444. At this stage, the sheet 410 is ready for singulation into individual electronic components.

Figures 4C, 4D:
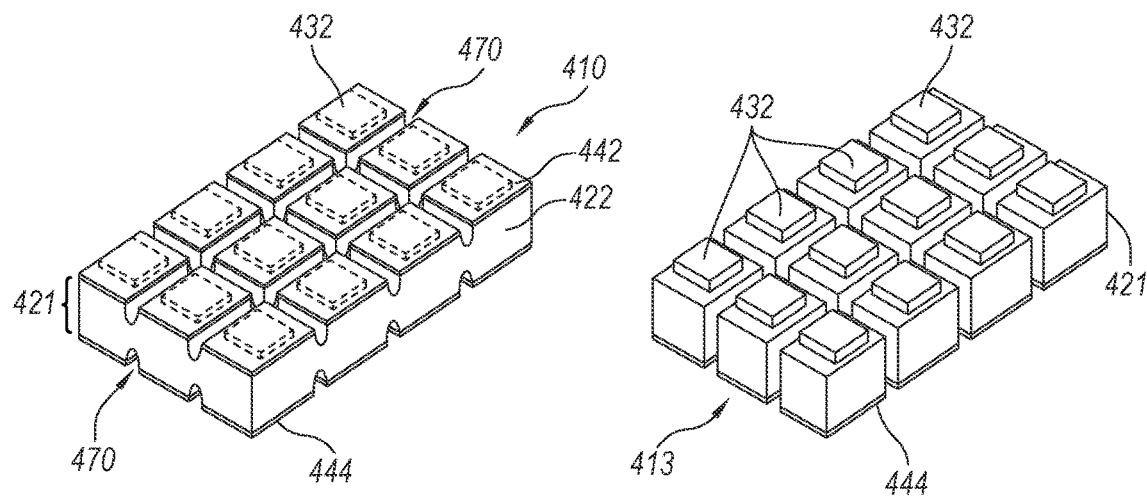

FIG. 4C illustrates the sheet 410 in a subsequent processing step after cutting tracks 470 have been formed to define borders around the individual electronic components. In the illustrated embodiment, the cutting tracks 470 are formed on either side of the sheet 410 and extend through the protective films 442, 444 partially into the glass substrate 422. In some embodiments, the cutting tracks 470 are formed only on one side of the glass substrate 422 and/or extend only to the surface of the glass substrate 422 (not extending into it). The cutting tracks 470 can be scribed using a laser and/or other suitable scoring means. In the illustrated embodiment, the cutting tracks 470 are continuous lines (e.g., trenches, elongated recesses, or valleys) spaced apart from each other to define the borders of the individual electronic components. In some embodiments, the cutting tracks 470 are a series of spaced apart broken lines or holes along the upper and/or lower surfaces of the sheet 410 (e.g., mimicking perforation holes in paper). When the sheet 410 is exposed to the chemical etchant, the chemical can contact the glass 421 through the cutting tracks 470 and dissolve glass 421 radially inward. If the cutting tracks 470 are sufficiently deep, the plurality of electronic components 432 can be separated into a plurality of individual electronic units 413 (FIG. 4D) before the chemical etchant dissolves any substantial part of the individual electronic units 413.

FIG. 4D illustrates a plurality of singulated electronic components 413. The electronic components 413 each comprise individual electronic features 432 disposed on flexible glass substrates 421. The flexible glass substrates 421 are thinned to increase device flexibility and remove defects from the lower surface, which is coated with the second protective film 444. The chemical singulation can provide clean, smooth sidewalls, without imposing additional cracks or other defects that would hinder the flexibility of the components 413. In the illustrated embodiment, the individual components 413 have been coated with a final protective coating (not shown) around the entire outer surface. The components 413 can be soft baked, the first protective film 442 can be removed to expose the individual electronic features 432, and then the components 413 can be hard baked to fully cure the final coating. It will also be appreciated that the plurality of electronic features 432 can be interconnected such that separation groups any number of them together including the entire sheet (thereby requiring no separation). It will also be appreciated that although illustrated as singular electronics per individual component 413, the individual electronic features 432 can include a plurality of circuits and/or a plurality of subcomponents.

In some embodiments, the individual electronic components 413 can include some, or all, of the components for a flexible biometric sensor system that can be integrated into a flexible biometric card or other biometric sensing device. For example, the individual electronic components 413 can include a fingerprint sensing area, an ASIC, and a microcontroller. By manufacturing some, or all, of the components for a fingerprint sensor, process 300 can be used to manufacture flexible fingerprint sensors for use, for example, in a BSoC. Because the sensor is manufactured using this technique, the BSoC will be able to endure significant amounts of mechanical stress, extending the life of the BSoC. Complete details on the components of a biometric system according to some embodiments of the present technology are described in U.S. Pat. No. 9,792,516B2, the entirety of which is incorporated by reference herein.

Figure 5:
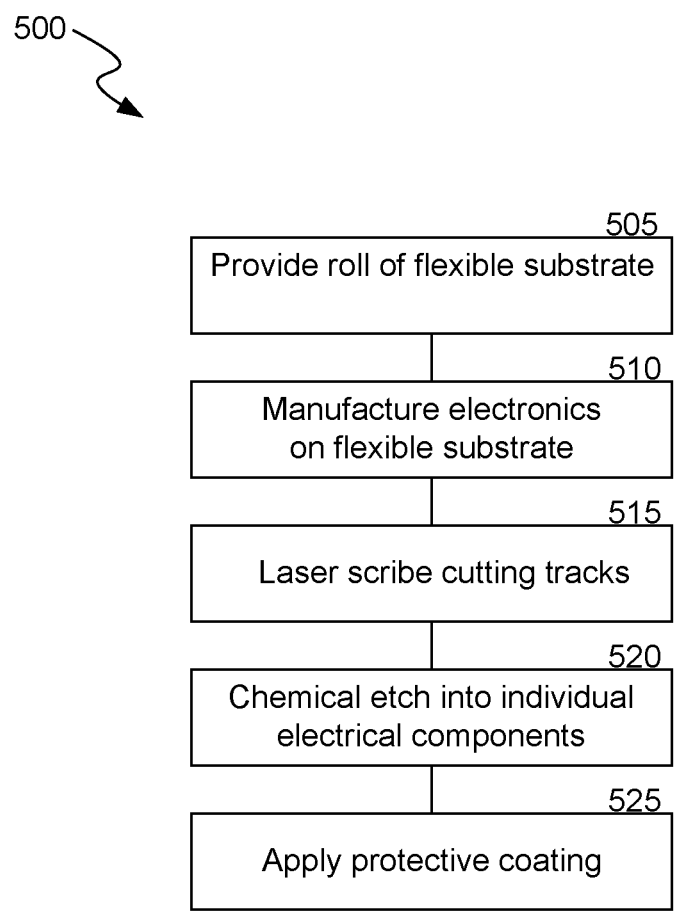
FIG. 5 is a block diagram of a roll-to-roll process for manufacturing flexible electronics according to some embodiments of the present technology.

FIG. 5 is a block diagram of a roll-to-roll process 500 for manufacturing flexible electronics according to some embodiments of the present technology. The roll-to-roll process 500 makes use of several of the methods discussed above with respect to FIGS. 2A-4D, adapted for use in a roll-to-roll system.

In block 505, the process 500 provides a roll flexible substrate (e.g., a flexible glass substrate, a laminate) for the manufacturing process. In some embodiments, preparing the flexible substrate includes chemically thinning the flexible glass substrate to remove cracks and other defects in the outer surface region lingering from earlier manufacturing process and/or pre-manufacture handling. In some embodiments, preparing the flexible glass substrate can include applying a protective film to the lower surface of the flexible substrate, thereby forming a laminate. In these embodiments, the protective film can provide mechanical and chemical protection to lower surface to reduce the introduction of defects while manufacturing electronics on the upper surface. Once the flexible glass substrate is otherwise prepared, the flexible glass substrate is wound onto a roll and configured in a roll-to-roll manufacturing system.

At block 510, the process 500 continues by forming electronic features on the front or first surface of the flexible glass substrate. For example, this may include unwinding the roll and passing the flexible glass substrate through one or more semiconductor manufacturing modules configured to deposit electronic features on the front or first surface of the glass substrate. In some embodiments, the modules can be used to accomplish low-temperature polycrystalline silicon (LTPS) fabrication. In one embodiment, for example, the flexible substrate is passed through a first film deposition module to deposit one or more layers of a plurality of TFTs on the upper surface of the substrate; a second module to undergo photolithography patterning; a third module to etch and strip the deposited film; a fourth module to inspect the TFTs; and/or a fifth module to deposit a final layer over the top. In various embodiments, the manufacturing process 500 can include other TFT-related modules, omit some described, and/or include different semiconductor processing modules. For example, the manufacturing process 500 may also include any other appropriate functional modules such as laser crystallization, ion doping, activation and various annealing processes. Further, it will be appreciated that all of the manufacturing processes relevant to the electronic unit being produced can occur in a single module, two modules, or any number of modules. It will be also appreciated that roll-to-roll processes can be used to manufacture other electronic units besides TFTs, which may require entirely different modules than those given above by way of example. After the electronics are formed on the flexible glass substrate, the unwound roll may include features similar to the sheet with spaced apart electrical features described above with respect to FIGS. 4A-4D.

At block 515, the roll can be separated into individual sheets. This can be accomplished in various ways. In some embodiments, the separation can adapt the chemical dicing process described above with respect to blocks 320 and 325 of FIG. 3 to separate individual sheets. For example, a laser can be used to etch a cutting track defining a border between sheets, and a chemical bath can be used to complete the separation. In embodiments where the sheet contains a single electronic unit (or a plurality of electronics that work in conjunction), incorporating the chemical etching process into the separation can reduce the number of defects introduced at the edges of the sheet. In embodiments where further singulation occurs to separate the sheet into a plurality of individual electronic components 413 (FIG. 4D), the defects introduced by traditional cutting mechanisms can be removed later by the chemical dicing singulation process.

At block 520, the process 500 can continue to use chemical dicing to complete singulation. In various embodiments, the process can follow the steps discussed above with respect to block 320 and block 325 in FIG. 3. That is, at block 520, the process 500 can make use of a combination of laser and chemical etching process to complete separation into individual electronic components. In these embodiments, the chemical etchant used to complete singulation can also be used to reduce defects introduced by the separation of sheets at block 515.

It will be appreciated that, in some embodiments, the process 500 can skip block 515. For example, in some embodiments, the roll can be passed through a singulation module that continuously completes the chemical dicing process directly on the roll in order to singulate individual electronic components.

At block 525, the process applies a final protective coating to the resulting electronic product (e.g., the separated sheet, the plurality of individual electronic units, etc.). In various embodiments, the process can follow the steps discussed above with respect to block 330 of FIG. 3 to apply the final coating. For example, in one embodiment, the process loads individual electronic units into a horizontal chuck and spray coat the individual electronic units, soft bakes the individual electronic units, removes the protective film from the upper surface of the individual electronic units, and/or hard bakes the individual electronic units.

Figure 6:
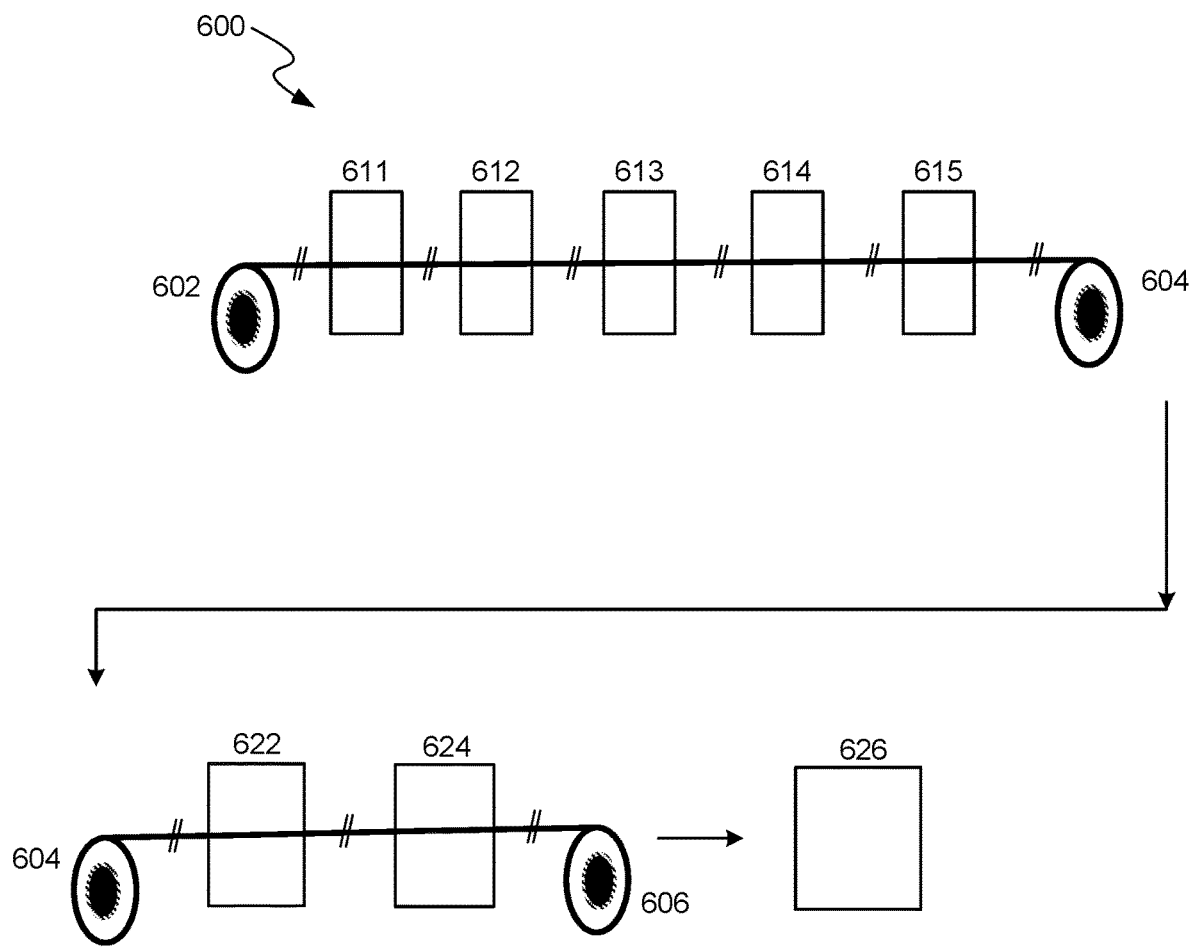
FIG. 6 is a partially schematic diagram illustrating a roll-to-roll process of manufacturing electronic assemblies in accordance with some embodiments of the present technology.

FIG. 6 is a partially schematic diagram illustrating a roll-to-roll process that can be used in accordance with one embodiment of the process 500 of FIG. 5. In the illustrated embodiment, the process 600 uses a first roll 602, a second roll 604, and a third roll 606. At the start of the process, the flexible substrate (e.g., a flexible glass substrate) is wound onto the first roll 602. The flexible substrate is then unwound from the first roll 602 through a series of modules 611-615 and wound onto the second roll 604. In some embodiments, the first roll 602 resists the winding onto the second roll 604 in order to impart tension in the flexible substrate through the manufacturing process.

In the illustrated embodiment, as the flexible substrate is wound onto the second roll 604, it is pulled through the modules 611-615. It will be understood that the total number of modules, as well as what manufacturing process occurs in each module, can vary as appropriate for the electronic components deposited on the upper surface of the flexible substrate. In one embodiment, for example, modules 611-615 can correspond to the various modules relevant to manufacturing TFTs discussed above. That is, in one embodiment, module 611 can be a film deposition module, module 612 can be a photolithography patterning module, module 613 can be an etch and strip module, module 614 can be an inspection module, and module 615 can be a second film deposition module.

In the illustrated embodiment, after electronics manufacturing is completed, the second roll 604 is moved to another station to be prepared for singulation. In the second station, the flexible substrate is unwound from a second roll 604 and wound onto a third roll 606. In some embodiments, the second roll 604 resists the winding onto the third roll 606 in order to create constant tension in the flexible substrate throughout the singulation preparation.

In the illustrated embodiment, as the flexible substrate is wound onto the third roll 606, it is pulled through various modules 622 and 624. It will be understood that the total number of modules, as well as what process occurs in each module, can vary as appropriate for the singulation process. In one embodiment, for example, the modules 622 and 624 can be used to prepare the roll to be separated into individual electronic units by applying a protective film to the electronics and etching cutting tracks around the individual electronic units. For example, module 622 can be used to apply a protective film to the upper surface of the flexible substrate. As discussed above, the protective film can, for example, be temporarily laminated onto the upper surface to protect the individual electronic units and upper surface from chemical and mechanical damage during singulation. Further, module 624 can be a laser etching module used to perform the first step of the chemical dicing process. In one embodiment for example, in module 624, a laser can be used to scribe continuous cutting tracks into the flexible substrate. As described above, the laser scribing process can happen on the upper surface, the lower surface, or both surfaces.

After scribing cutting tracks into the flexible substrate, at module 626, the flexible substrate can be unwound from the third roll 606 into a chemical etching tank to complete the singulation. In some embodiments, after singulation, the plurality of individual units can have a final protective coating applied to them and/or have the protective film removed from the upper surface.

When electronics are manufactured according to the methods described above, the flexibility of the flexible substrate, such as a flexible glass, can be increased so much that the flexible substrate, when flexed or bent, is no longer the failure point under mechanical stress. Rather, the electronic features disposed on the flexible substrate serve as the limiting factor for overall device flexibility (e.g., due to defects and/or sharp edges). Accordingly, the systems and methods disclosed herein can utilize chemical thinning to reduce and/or remove cracks and defects from the flexible glass substrates allow the electrical features to be manufactured directly on glass and the resultant electronic components to be integrated into flexible electronic systems (e.g., flexible cards, wearables, scanners, displays).

Figure 7A:
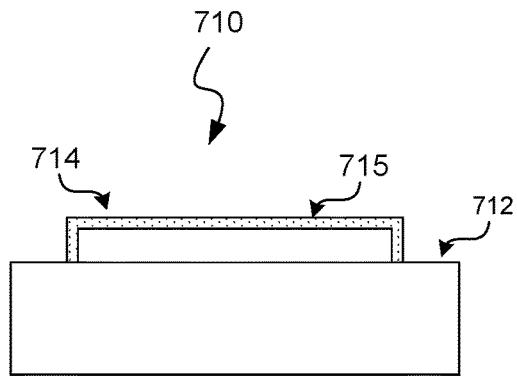
FIGS. 7A-7D are cross-sectional side views illustrating a method of manufacturing an electronic component in accordance with embodiments of the present technology.

FIGS. 7A-7D are cross-sectional side views of an electronic component at various stages of manufacturing to improve the flexibility of the electronic component, in accordance with some embodiments of the present technology. FIG. 7A illustrates a singulated electronic component 710 (also referred to as an "electronic device" or "electronic unit") at a first processing step. As illustrated, the electronic component 710 includes a flexible substrate 712 (e.g., glass), and an electronic feature 714 (e.g., a thin film circuit). The electronic component 710 has an outer surface 715 (also referred to as a "first surface 715") and edges 716. These edges 716 may be formed by surfaces that join a sharp, thin apex. In some embodiments, for example, the flexible substrate 712 can be a flexible glass thinned in accordance with the process 300 described in FIG. 3; while the electronic feature 714 can be a relatively brittle TFT manufactured through plasma-enhanced chemical vapor deposition (PECVD) of silicon oxide, silicon nitride, indium tin oxide (ITO) and/or Molybdenum (Mo).

As illustrated in FIG. 7A, the outer surface 715 contains a plurality of defects (e.g., cracks, edge defects, or impurities) that may, for example, result from stresses during manufacturing. For example, the final step in patterning a thin film circuit often involves stripping a photoresist mask, followed by rinsing the thin film. Ultrasonic agitation, or other means of agitation, are commonly used for fast and clean photoresist removal. However, the agitation and subsequent rinse tend to aggravate the surface of the thin film, resulting in edge defects, flaws, and/or micro cracks in the outer surface 715. These defects are especially introduced around any exposed edges of the thin film where a high degree of stress concentration usually exists during agitation. Further, like the defects discussed with respect to FIG. 2B, the defects in the outer surface 715 typically limit the flexibility of the electronic feature 714. In embodiments where the electronic feature 714 is a PECVD-manufactured TFT film, the film materials used are relatively brittle materials that cannot be replaced.

Instead, in some embodiments of the present technology, a blanket etching process can be used to reduce the surface defects in the outer surface 715 of the electronic feature 714. In some embodiments, the blanket etching process can use the same etchant used for etching during the manufacturing processes described above. In some embodiments, where a TFT is manufactured by a process including an etch and strip phase, the blanket etching process can use the same etchant used to etch the film. In some embodiments, for example, the blanket etching process can use a hydrofluoric acid in ammonium fluoride solution with a $HF:NH_4F$ ratio of 1:7. In some embodiments, the etchants used can be more highly concentrated, requiring a very brief exposure to remove the outer surface 715 and therefor reduce defects in the electronic feature 714. In some embodiments, the etchant can be more diluted, requiring a longer exposure but providing more control during the process.

Figure 7B:
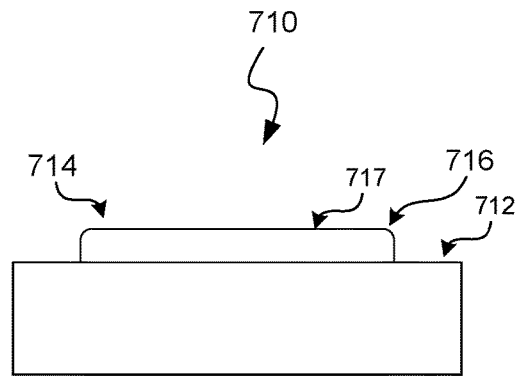

FIG. 7B illustrates the electronic unit 710 after processing to remove defects or impurities from the electronic component 714. As illustrated, the outer surface 715 has been removed to expose a surface 717 having fewer defects or impurities. Further, the edges 716 have been rounded, reducing the amount of stress that will be concentrated in the edges 716. As a result of exposing the surface 717 with fewer defects, the flexibility of the electronic feature 714, and therefore the electronic component 710, is improved.

Figure 7C:
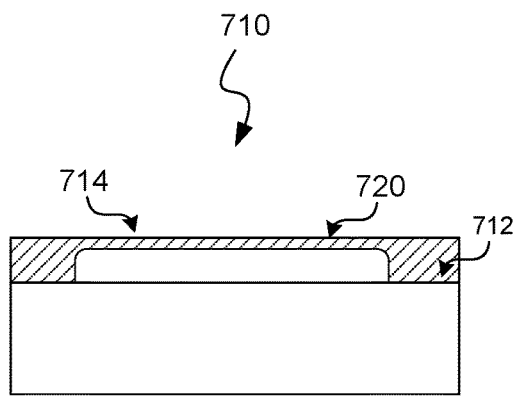

FIG. 7C illustrates an example of the electronic component 710 with a protective film 720 disposed over the upper surface 714 of the electronic component 710, in accordance with some embodiments of the present technology. In some embodiments, the protective film 720 can provide mechanical protection (e.g., against scratches, contact-triggered stress, etc.) to the edges 716 and surface 717. In some embodiments, the protective film 720 can act as a planarization layer over the upper surface 714 of the electronic component 710. In some embodiments, the protective film 720 can be a photo-patternable organic or inorganic-organic hybrid material, such as those ordinarily used in fabricating high-resolution LCD or OLED displays. Further, in some embodiments, the protective film 720 can be selectively applied to the upper surface 714 of the electronic component 710.

Figure 7D:
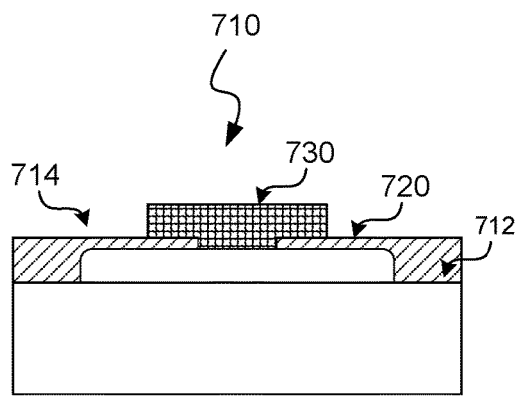

FIG. 7D illustrates an example of the electronic component 710 with the protective film 720 disposed selectively over the upper surface 714 of the electronic component 710, in accordance with some embodiments of the present technology. In the illustrated embodiment, the protective film 720 is disposed with a via hole over a portion of the electronic feature 714, allowing a layer 730 to make contact with the electronic feature 714. In some embodiments, for example the layer 730 can electronically couple the electronic feature 714 to other electronics components (not shown). In some embodiments, the electronic feature 714 can be a relatively brittle electrode (e.g., ITO or Mo), protected by the protective film 720 and in contact with a relatively non-brittle electrode in layer 730.

It will be understood that the schematic diagrams and electronic component 710 illustrated in FIGS. 7A-7D are shown by way of example only. Many variations of the embodiments may exist without departing from the underlying principle of the method of improving the flexibility of electronics. For example, while the electronic feature 714 is shown to lie directly on top of the substrate 712, there may be one or more thin films and/or other layers between the electronic feature 714 and the substrate 712; while a single substrate 712 is shown in FIGS. 7A-7D, the substrate 712 can also consist of multiple layers (e.g., a layer of flexible plastic material (such as PI) laminated onto a rigid carrier-substrate (e.g., a rigid glass).

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those skilled in the relevant art will recognize. For example, although steps are presented in a given order above, alternative embodiments may perform steps in a different order. Furthermore, the various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded.

From the foregoing, it will also be appreciated that various modifications may be made without deviating from the disclosure or the technology. For example, one of ordinary skill in the art will understand that various components of the technology can be further divided into sub-methods, or that various systems and methods of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A method for manufacturing flexible electronics, comprising:
applying a first protective material to a plurality of electronic features of an electronic assembly, the electronic assembly including a substrate and the plurality of electronic features disposed on a first side of the substrate, the substrate comprising glass;
exposing a second side of the substrate to a chemical that thins the substrate to a predetermined thickness, the second side being opposite the first side of the substrate;

applying a second protective material to the second side of the substrate;

applying a third protective material to exterior surfaces of the electronic assembly, wherein the exterior surfaces include at least one side surface, the third protective material comprising a liquid polymer; and soft baking the electronic assembly to partially cure the liquid polymer.

2. The method of claim 1, further comprising:

removing the first protective material from the first side; and hard baking the electronic assembly to fully cure the liquid polymer.

3. The method of claim 1, wherein exposing the second side of the substrate to the chemical comprises submerging at least the second side of the substrate in a first chemical etching tank.

4. The method of claim 1, further comprising:

separating the plurality of electronic features into individual electronic components before the third protective material is applied.

5. The method of claim 3, wherein the third protective material is applied around at least a portion of the individual electronic components.

6. The method of claim 4, wherein separating the plurality of electronic features comprises at least partially submerging the electronic assembly into a second chemical etching tank to separate the substrate along cutting tracks in the substrate, wherein the cutting tracks define a border around the individual electronic components.

7. The method of claim 6, wherein separating the plurality of electronic features comprises scribing the cutting tracks on the first side and/or the second side of the substrate using a laser.

8. The method of claim 6, wherein separating the plurality of electronic features comprises forming a plurality of holes incrementally spaced apart from each other to define the cutting tracks.

9. The method of claim 1, wherein exposing the second side to the chemical comprises submerging the electronic assembly in a chemical etching tank.

10. The method of claim 1, wherein exposing the second side to the chemical comprises removing material from the substrate to reduce defects from the second side of the substrate.

11. The method of claim 1, wherein exposing the second side of the substrate to the chemical that thins the substrate to the predetermined thickness comprises chemically thinning the substrate to at most 0.2 mm in thickness.

12. The method of claim 1, wherein the plurality of electronic features include a plurality of thin film transistors.

13. The method of claim 1, wherein the plurality of electronic features comprises fingerprint sensors.

14. The method of claim 1, wherein applying the second protective material to the second side of the substrate comprises permanently bonding a film having high impact absorbent properties to the second side of the substrate.

15. An electronic component, comprising:

a substrate comprising glass;

at least one electronic feature disposed on a first side of the substrate;

a protective film disposed on the second side of the substrate; and a protective coating disposed around the electronic component wherein the protective film on the second side of the substrate and side walls of the electronic component are covered by the protective coating, while the at least one electronic feature on the first side of the substrate is exposed, wherein the protective coating is a cured polymer coating.

16. The electronic component of claim 15, wherein the substrate is a thin, flexible, and defect-free glass substrate.

17. The electronic component of claim 15, wherein the substrate is a glass substrate and has a thickness of at most 0.2 mm.

18. The electronic component of claim 15, wherein the protective coating covers an entire outer surface of the electronic component except an area where the at least one electronic feature on the first side of the substrate is exposed.

19. The electronic component of claim 15, further comprising another protective film disposed on the first side of the substrate.

* * * * *